US009459281B2

(12) United States Patent
Cho

(10) Patent No.: US 9,459,281 B2
(45) Date of Patent: Oct. 4, 2016

(54) SOCKET, AND TEST APPARATUS AND METHOD USING THE SOCKET

(75) Inventor: Byeong-Hwan Cho, Yongin-si (KR)

(73) Assignee: SAMSUNG ELECTRONICS CO., LTD., Samsung-ro, Yeongtang-gu, Suwon-si, Gyeonggi-do (KR)

( * ) Notice: Subject to any disclaimer, the term of this patent is extended or adjusted under 35 U.S.C. 154(b) by 1109 days.

(21) Appl. No.: 13/484,845

(22) Filed: May 31, 2012

(65) Prior Publication Data

US 2012/0235695 A1 Sep. 20, 2012

Related U.S. Application Data

(60) Continuation of application No. 13/087,590, filed on Apr. 15, 2011, now Pat. No. 8,242,794, which is a division of application No. 12/783,722, filed on May 20, 2010, now abandoned, which is a division of application No. 12/215,769, filed on Jun. 30, 2008, now Pat. No. 7,737,710.

(30) Foreign Application Priority Data

Jul. 10, 2007 (KR) .................. 10-2007-0069259

(51) Int. Cl.
*G01R 1/04* (2006.01)
(52) U.S. Cl.
CPC ........... *G01R 1/0483* (2013.01); *G01R 1/0466* (2013.01); *H01L 2224/48091* (2013.01); *H01L 2224/73265* (2013.01)
(58) Field of Classification Search
CPC .................. G01R 1/0466; G01R 1/0483
See application file for complete search history.

(56) References Cited

U.S. PATENT DOCUMENTS

| 5,663,654 | A | * | 9/1997 | Wood et al. ............. 324/754.09 |
| 6,134,685 | A | | 10/2000 | Spano |
| 6,489,790 | B1 | | 12/2002 | An et al. |
| 6,583,636 | B2 | | 6/2003 | Brule |
| 6,861,288 | B2 | | 3/2005 | Shim et al. |
| 7,355,426 | B2 | | 4/2008 | Ahmad et al. |
| 7,484,698 | B2 | | 2/2009 | Budagher |
| 2001/0000947 | A1 | * | 5/2001 | Swart ................... G01R 1/0483 324/756.02 |
| 2006/0186905 | A1 | | 8/2006 | Kohashi et al. |
| 2007/0013404 | A1 | | 1/2007 | Yoon et al. |
| 2007/0018300 | A1 | | 1/2007 | Ryu et al. |
| 2007/0109000 | A1 | * | 5/2007 | Inoue ................... G01R 1/0483 324/756.05 |

(Continued)

FOREIGN PATENT DOCUMENTS

| JP | 2-062974 | 3/1990 |
| JP | 07-239362 | 9/1995 |

(Continued)

*Primary Examiner* — Benjamin M Baldridge
*Assistant Examiner* — Courtney McDonnough
(74) *Attorney, Agent, or Firm* — Muir Patent Law, PLLC

(57) ABSTRACT

An apparatus for testing electric characteristics of a test object including first connection terminals on a bottom surface and second connection terminals on a top surface, the apparatus comprises a test board comprising first pads on a predetermined surface; a socket configured to electrically connect the test object to the test board; and a handler configured to transport the test object to the socket. The socket comprises a first connection unit configured to be electrically connected to the first connection terminals of the test object and a second connection unit configured to be electrically connected to the second connection terminals of the test object.

20 Claims, 7 Drawing Sheets

(56) References Cited

U.S. PATENT DOCUMENTS

| | | |
|---|---|---|
| 2007/0170935 A1 | 7/2007 | Huang et al. |
| 2007/0290320 A1 | 12/2007 | Onodera et al. |
| 2008/0054261 A1* | 3/2008 | Song .................. G01R 31/2884 257/48 |
| 2008/0094086 A1 | 4/2008 | Kim |
| 2008/0197867 A1 | 8/2008 | Whokhlu et al. |
| 2009/0278559 A1 | 11/2009 | Inoue et al. |
| 2010/0327879 A1 | 12/2010 | Yasuzawa |

FOREIGN PATENT DOCUMENTS

| | | |
|---|---|---|
| JP | 2000-040571 A | 2/2000 |
| JP | 2000-292485 A | 10/2000 |
| JP | 2006-186247 A | 7/2006 |
| JP | 2006-269404 A | 10/2006 |
| JP | 2007163463 A | 6/2007 |
| KR | 2001-0087642 | 9/2001 |
| KR | 10-2004-0102267 | 12/2004 |

* cited by examiner

SOCKET, AND TEST APPARATUS AND METHOD USING THE SOCKET

CROSS-REFERENCE TO RELATED APPLICATIONS

This application is a continuation application of U.S. patent application Ser. No. 13/087,590 filed on Apr. 15, 2011, now U.S. Pat. No. 8,242,794 which is a divisional application of U.S. patent application Ser. No. 12/783,722 filed on May 20, 2010, now abandoned which is a divisional application of U.S. patent application Ser. No. 12/215,769, filed on Jun. 30, 2008, now U.S. Pat. No. 7,737,710 which claims the benefit of Korean patent application number 10-2007-0069259, filed on Jul. 10, 2007, in the Korean Intellectual Property Office, the contents of which applications are incorporated herein in their entirety by reference.

FIELD OF THE INVENTION

The present invention disclosed herein relates to a test apparatus and method, and more particularly, to an apparatus and method for testing electrical characteristics of a semiconductor device package.

BACKGROUND

In semiconductor industries, packaging, technology has been advanced for increasing reliability in packaging and mounting small-sized integrated semiconductor chips. For example, demands for miniaturization have accelerated the development of small packages having sizes close to the sizes of integrated semiconductor chips, and demands for reliable mounting technology have spurred the development of packaging technology for efficiently packaging semiconductor chips and improving mechanical and electrical characteristics of the packaged semiconductor chips.

In addition, various technologies have been, developed to provide high-capacity semiconductor, products and satisfy the demands for small-sized, high-performance electric/ electronic products. For example, high-capacity semiconductor products can be fabricated using highly integrated memory chips (i.e., high-capacity memory chips). Highly integrated memory chips can be fabricated by integrating a larger number of cells into a given region of the memory chip.

However, it is difficult and takes a large amount of time to develop highly integrated memory chips. For example, it is necessary to develop fine pattern forming technology for highly integrated memory chips. However, it is difficult and takes a large amount of time to develop the fine pattern forming technology. Accordingly, slacking technology has been developed as another way of providing high capacity semiconductor products. According to the stacking technology, at least two semiconductor chips or semiconductor device packages are vertically stacked for providing high-capacity semiconductor products. For example, a 128-M memory chip can be fabricated by stacking two; 64-M memory chips, and a 256-M memory chip can be fabricated by stacking two 128-M memory chips. In addition to the increase of storage capacity, semiconductor device packages can be mounted more densely and efficiently by using the stacking technology.

In general, a stack type (sometimes referred to as a "multi-chip") semiconductor device package includes a first semiconductor device package and a second semiconductor device package. Connection terminals, such as a ball grid array (BGA), are disposed on a bottom surface of the first semiconductor device package for electrically connecting the first semiconductor device package to an external circuit, such as a circuit formed on a system substrate; and connection terminals, such as pads, are disposed on a top surface of the first semiconductor device package for electrically; connecting the first semiconductor device package to the second semiconductor device package. In addition, connection terminals, such as pads, are also disposed on a bottom surface of the second semiconductor device package for electrically connecting the second semiconductor device package to the first semiconductor device package. Solder balls can be disposed between the connection terminals of the first and second semiconductor device packages for electrically connecting the first and second semiconductor device packages.

Electric characteristics, such as electrical connection states of the connection terminals of the first semiconductor device package, can be tested as follows. First, the electric characteristics of the connection terminals, disposed on the bottom surface of the first semiconductor device package are tested using a test apparatus. Then, if it is determined that the electric characteristics of the connection terminals of the bottom surface of the first, semiconductor device, package are allowable, the electric characteristics of the connection terminals disposed on the top surface of the first semiconductor device package are tested. In detail, after connecting the second semiconductor device package to the first semiconductor device package using solder balls, the electric characteristics of the connection terminals of the top surface of the first semiconductor device package are tested by applying a signal to the second semiconductor device package through the connection terminals of the top surface of the first semiconductor device package and evaluating the operation state of the second semiconductor device package using the applied signal.

However, the above method takes a large amount of time to test all the connection terminals of the top and bottom surfaces of the first semiconductor device package.

Moreover, even if the second semiconductor device package is not defective, the second semiconductor device package can be discarded if it is determined that the electric characteristics of the connection terminals of the top surface of the first semiconductor device package are not allowable, i.e., defective.

SUMMARY OF THE INVENTION

In accordance with the present invention, provided is an apparatus and method for efficiently testing electric characteristics of a semiconductor device package, such as electric connection states of the semiconductor device package including connection/terminals on top and bottom surfaces thereof.

In accordance with the present invention, also provided is an apparatus and method for rapidly testing electric characteristics of a semiconductor package, such as electric connection states of a semiconductor device package—including connection terminals on top and bottom surfaces thereof.

In accordance with the present invention, also provided is an apparatus and method for testing electric connection states of a multi-chip semiconductor device package that eliminates the possibility of discarding a non-defective upper semiconductor device package according to the test results of a lower semiconductor device package.

Additional features and advantages of the invention will be set forth in the description which follows, and in part will be apparent from the description, or can be learned by practice of the invention.

In accordance, with one aspect of the present invention, provided is an apparatus for testing electric characteristics of a test object including first connection terminals on a bottom surface and second connection terminals on a top surface. The apparatus includes a test board including first pads on a predetermined surface, a socket configured to electrically connect the test object to the test board, and a handler configured to transport the test object to the socket. The socket includes a first connection unit configured to electrically connect to the first Connection terminals of the test object, and a second connection unit configured to electrically connect to the second connection terminals of the test object.

The first connection unit can include first pins configured to electrically connect the first pads of the test board to the first connection terminals of the test object. And the second connection unit can include: a socket substrate including first pads and second pads, electrically connected together, second pins configured to electrically connect the first pads of the socket substrate to the second connection terminals of the test object; and a reference electronic device configured to electrically connect to the second pads of the socket substrate and to exchange electric signals with the test object.

The socket can further include: a first body; and a second body configured to detachably couple to the first body, wherein the first pins of the first connection unit are disposed in first holes formed vertically through the first body, the second pins of the second connection unit are disposed in second holes formed vertically through the second body, and the socket substrate is disposed at a top portion of the second body.

A recess can be formed in a top surface of the first body or a bottom surface of the second body for receiving the test object.

The socket substrate and the second body can be fixed to the handler.

An alignment pin can be disposed on one of the first body and the second body, and an alignment hole can be formed in the other of the first body and the second body for receiving the alignment pin.

The apparatus can further include a support configured to fix the first body to the test board and having an opening formed therein for receiving the first body, wherein an alignment pin can be disposed on one of the support and the handler, and an alignment hole can be formed in the other of the support and the handler and configured to receive the alignment pin.

The reference electronic device can be soldered to the socket substrate.

The reference electronic device can be detachably attached to the socket substrate.

The test object can be a package in which a first semiconductor device is packaged, and the reference electronic device can include a second semiconductor device configured to exchange electric signals with the first semiconductor device.

The test object can be a first semiconductor device package in which a first semiconductor device is packaged, and the reference electronic device can include a second semiconductor device of a second semiconductor device, package to be stacked on the first semiconductor device package.

The first semiconductor device can include a logic chip, and the second semiconductor device can include a memory chip.

The test board can further include second pads, and the first connection unit can include first pins configured to electrically connect the first pads of the test board to the first connection terminals of the test object. And the second connection unit can include: a socket substrate including first pads and second pads electrically connected together; second pins configured to electrically connect the first pads of the socket substrate to the second connection terminals of the test object; and third pins configured to electrically connect the second pads of the socket substrate to the second pads of the test board.

The socket can further include: a first body including first holes formed vertically through the first body and configured to receive the first pins of the first connection unit; and a second body including second holes formed vertically through the second body and configured to receive the second pins of the second connection unit, wherein a recess is formed in a top surface of the first body or a bottom surface of the second body and configured to receive the test object, and third holes are formed in one of the first and second bodies in which the recess is formed, the third holes being located outside the recess and configured to receive the third pins of the second connection unit.

The socket substrate and the second body can be fixed to the handler.

An alignment pin can be disposed on one of the first body and the second body, and an alignment hole can be formed in the other of the first body and the second body and configured to receive the alignment pin.

The apparatus can further include a support configured to fix the first body to the test board, and having an opening formed therein for receiving the first body, wherein an alignment pin can be disposed on one of the first body and the second body, and an alignment hole can be formed in the other of the first body and the second body for receiving the alignment pin.

The test object can be a semiconductor device package.

In accordance with another aspect of the present invention, provided is a socket for use in an apparatus for testing electric characteristics of a test object. The socket includes: a housing configured to receive the test object; a first connection unit configured to be electrically connected to first connection terminals disposed on a bottom surface of the test object when the test object is placed in the housing; and a second connection unit configured to be electrically connected to second connection terminals disposed on a top surface of the test object when the test object is placed in the housing.

The housing can include: a first body; and a second, body configured to detachably couple to the first body, wherein the first connection, unit can include first pins inserted in vertical holes formed through the first body, wherein the second connection unit can include: a socket substrate including first pads and second pads electrically connected together; second pins configured to electrically connect the first pads of the socket substrate to the second connection terminals of the test object; and a reference, electronic device configured to electrically connect to the second pads of the socket substrate and to exchange, electric signals with the test object.

In the socket a recess can be formed in a top surface of the first body or a bottom surface of the second body and configured to receive the test object.

An alignment pin can be disposed on one of the first body and the second body, and an alignment hole can be formed in the other of the first body and the second body and configured to receive the alignment pin.

The housing can include: a first body; and a second body configured to detachably couple to the first body, wherein the first connection unit can include first pins inserted in first holes formed vertically through the first body, wherein the second connection unit can include: a socket substrate including first pads and second pads electrically connected together; second pins inserted in second holes formed vertically through the second body and configured to electrically connect the first pads of the socket substrate to the second connection terminals of the test object; and third pins inserted in third holes formed in one of the first body and the second body and configured to electrically connect to the second pads of the socket substrate.

A recess can be formed in one of the first and second bodies and configured to receive the test object, and the other of the first and second bodies can be inserted in the recess when the test object is tested.

An alignment pin can be disposed on one of the first body and the second body, and an alignment hole can be formed in the other of the first body and the second body and configured to receive the alignment pin.

In accordance with still another aspect of the present invention, there is provided a method of testing electric characteristics of a test object including first connection terminals on a bottom surface and second connection terminals on a top surface. The method includes: providing a socket and loading the test object in the socket, the socket having first pins electrically contacting the first connection terminals of the test object and second pins electrically contacting the second connection terminals of the test object. The method further includes applying an electric, signal from a test board to the first pins to simultaneously test electric characteristics of the first and second connection terminals of the test object.

The method can further include electrically connecting the second pins of the socket to an electronic device using a socket substrate: that allows the electronic device to exchange electric signals with the test object, including transmitting the electric signal output from the test board back to the test board through the first pins, the test object, the second pins, the socket substrate, the electronic device, the socket substrate, the second pins, the test object, and the first pins.

The test object can be a semiconductor device package in which a first semiconductor device is packaged, and the electronic device can comprise a second semiconductor device exchanging electric signals with the first semiconductor device.

The test object can be a first semiconductor device package in which a first semiconductor device is packaged, and the electronic device can comprise a second semiconductor device of a second semiconductor device package to be stacked on the first semiconductor device package.

The first semiconductor device can comprise a logic chip, and the second semiconductor device can comprise a memory chip.

The method can further include providing third pins contacting the test board, and a socket substrate electrically connecting, the second, pins and the third pins, including transmitting the electric signal output from the test board back to the test board through the first pins the test object, the second pins, the socket substrate, and the third pins.

The test object can be semiconductor device package.

The test object can be one of a plurality of semiconductor device packages included in a multi-chip semiconductor device/package.

BRIEF DESCRIPTION OF THE FIGURES

The accompanying figures are included to provide a further understanding of the present invention, and are incorporated in and constitute a part of this specification. The drawings illustrate exemplary embodiments of devices and methods in accordance with aspects of the present invention and, together with the description, serve to explain principles of the present invention. In the figures.

DETAILED DESCRIPTION OF PREFERRED EMBODIMENTS

Figure 1:
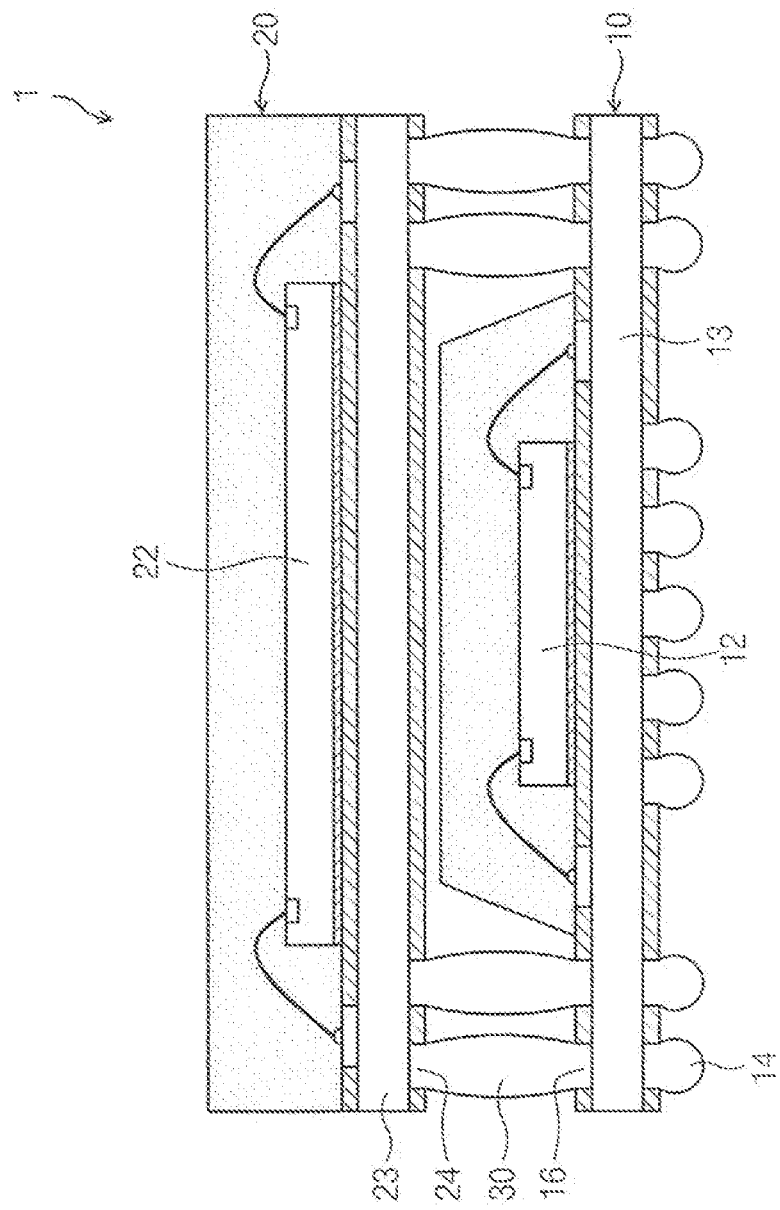
FIG. 1 is a schematic; cross-sectional view illustrating an embodiment of a multi-chip semiconductor device package according to an aspect of the present invention.

Preferred embodiments in accordance with aspects of the present invention will be described below in more detail with reference to FIGS. 1 through 1. The present invention can, however, be embodied in different forms and should not be construed as limited to the embodiments set forth herein. In the figures, the dimensions of layers and regions are exaggerate for clarity of illustration. Descriptions of well-known elements may be omitted for conciseness.

It will be understood that, although the terms first, second, etc. are be used herein to describe various elements, these elements should hot be limited by these terms. These terms are used to distinguish the element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It wilt be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include, the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups, thereof.

Spatially relative terms, such as "beneath," "below," "lower," "above," "upper" and the like may be used to describe an element and/or feature's relationship to another element(s) and/pr feature(s) as, for example, illustrated in the figures. If will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

In the following descriptions of preferred embodiments, test apparatuses and test methods are explained using a lower semiconductor device package of a multi-chip semiconductor device package as a test object. However, the present invention is not limited to the lower semiconductor device package. That is, the present invention can be used to test various electronic components having connection terminals on top and bottom surfaces.

FIG. 1 is a schematic cross-sectional view illustrating en embodiment of a multi-chip semiconductor device package 1 according to an aspect of the present invention. Referring to FIG. 1, the multi-chip semiconductor device package 1 includes a first semiconductor device package 10 and a second semiconductor device package 20 disposed above the first semiconductor device package 10. The first semiconductor device package 10 includes a first semiconductor device 12 and a substrate 13. First connection terminals 14 are disposed on a bottom surface of the first semiconductor device, package 10 for electrically connecting the multi-chip semiconductor device package 1 to an external circuit member, such as a system substrate, and second connection terminals 16 are disposed on a top surface of the first semiconductor device package 10 for electrically, connecting the first semiconductor device package 10 to the second semiconductor device package 20. The first connection terminals 14 can have a ball shape like a ball gray array (BGA), and the connection terminals 16 can have a pad shape.

The semiconductor device package 20 includes a second semiconductor device 22 and a substrate 23. Connection terminals 24 are disposed on a bottom surface of the semiconductor device package 20 for electrically connecting the semiconductor device package 20 to the first semiconductor device package 10. The first semiconductor device package 10 and the semiconductor device package 20 are connected through solder balls 30 in this embodiment.

For example, the first semiconductor device 12 can include a logic chip, and the semiconductor device 22 can include a memory chip. In such a case, interconnection lines (not shown) can be formed, on the substrate 13 for electrically connecting the first and second connection terminals 14 and 16 to the first semiconductor device 12. The memory chip can be a double data rate (DDR) memory chip. However, as would be appreciated by those skilled in the art having the benefit of this disclosure, the memory chip could be a different memory chip, such as a flash memory chip.

In the exemplary embodiments described below, the first semiconductor device package 10 is described as a test target, object, and testing of electric connection states or other characteristics of the first and second connection terminals 14 and 16 of the first semiconductor device package 10 is explained.

Figure 2:
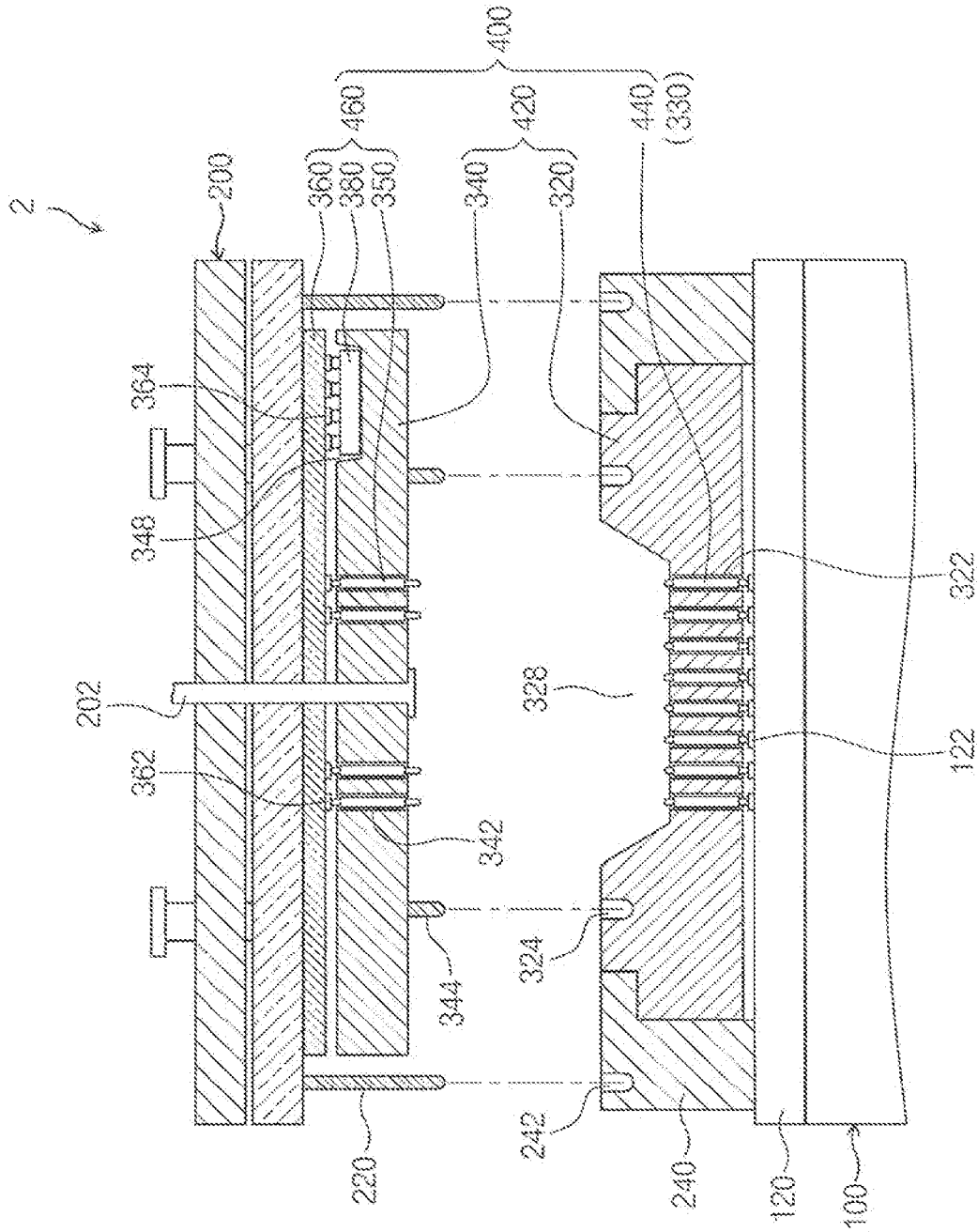
FIG. 2 is an exploded cross-sectional view illustrating a first embodiment of a test apparatus according to an aspect of the present invention.
Figure 3:
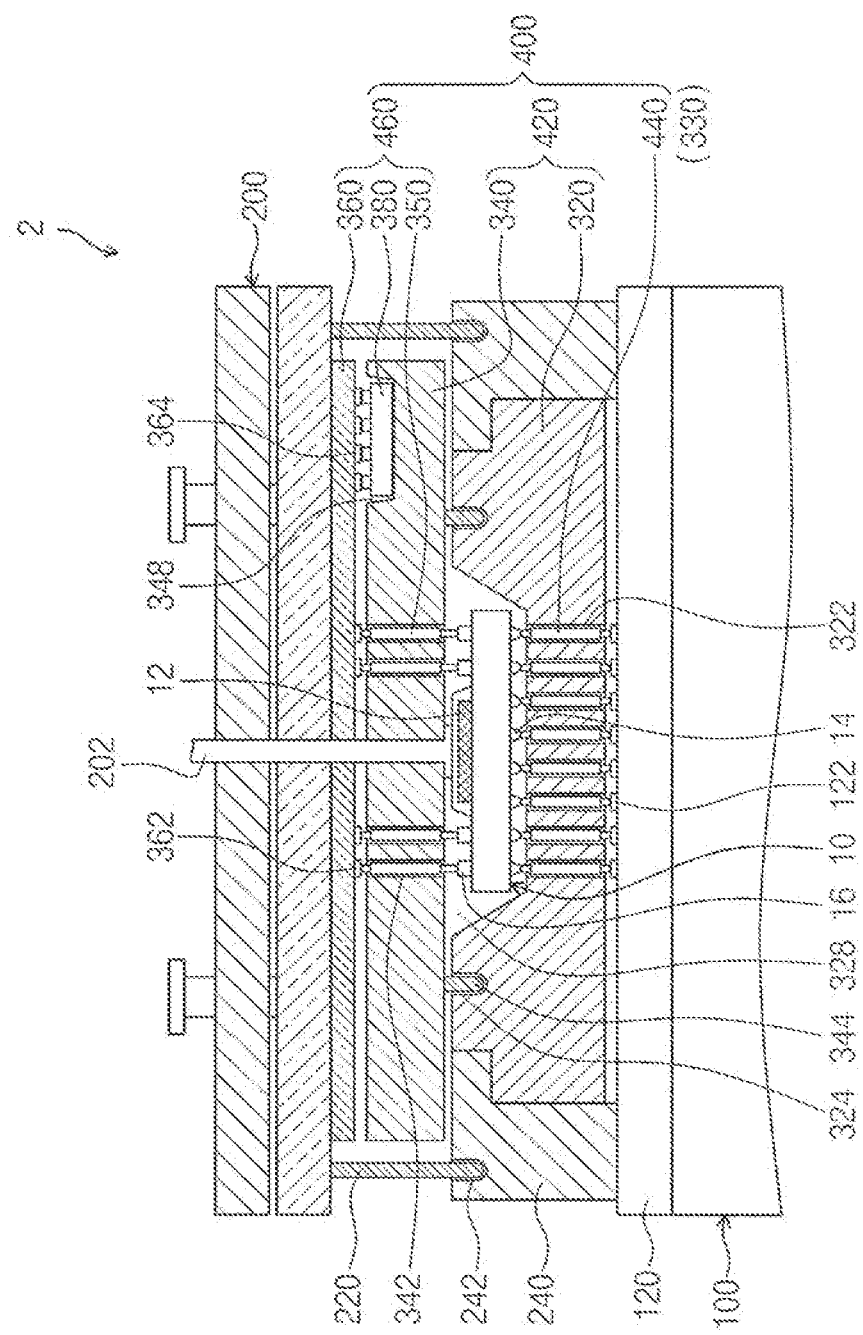
FIG. 3 is a cross-sectional view illustrating the test apparatus of FIG. 2 assembled for testing, a semiconductor device package loaded therein.

FIG. 2 is air exploded cross-sectional view illustrating a first embodiment of a test apparatus 2 according to an aspect of the present invention, FIG. 3 is a cross-sectional view illustrating the test apparatus 2 assembled for testing the first semiconductor device package 10.

Referring to FIGS. 2 and 3, the test apparatus 2 includes a test unit 100, a handler 200, and a socket 400. The test unit 100 applies an input signal to the first semiconductor device package 10 (hereinafter, referred to as a test object) and receives a signal output from the test object 10 in response to the input signal. The test unit 100 evaluates the state of the test object 10 using the signal output from the test object 10. The test unit 100 includes a test board 120. First pads 122 are formed on a top surface of the test board 120. Automatic test equipment can be used as the test unit 100. The socket 400 electrically connects the first semiconductor device package 10 to the test-board 120. The handler 200 is configured to move the test object 10 to the socket 400. The test unit 100 and the handler 200 have typical, structures in this embodiment. Thus, detailed descriptions of the test unit 100 and handler 200 will be omitted here. The socket 400 is a characteristic element of the test apparatus 2. In the following description, the socket 400 will be mainly described, in detail, and features of the test unit 100 and handler 200 that differ from typical structures will be described.

The socket 400 includes a housing 420, a first connection unit 440, and a second connection unit 460. The housing 420 is disposed between the handler 200 and the test board 120 and configured for receiving the test object 10 during a test operation. The first connection unit 440 is used to evaluate electrical connection states of the first connection terminals 14 of the test object 10. The second connection unit 460 is used to evaluate electrical connection states of the connection terminals 16 of the test object 10.

The first connection unit 440 includes a plurality of first pins 330 for electrically connecting the first connection terminals 14 of the test object 10 directly to the first pads 122 of the test board 120. Pogo pins having elastic cores (not shown) can be used as the first pins 330. Ends of the first pins 330 are brought into contact with the first connection terminals 14 of the test object 10, respectively, and the other ends of the first pins 330 are brought into contact with the first pads 122 of the test board 120, respectively.

The second connection unit 460 includes a socket substrate 360, second pins 350, and a reference electronic device 380. The reference electronic device 380 is a semiconductor device capable of exchanging electrical, signals with the test object 10. In the current embodiment, the reference electronic device 380 can be the semiconductor device package 20 to be stacked on the test object 10. Alternatively, the reference electronic device 380 can be the semiconductor device 22 of the semiconductor device package 20. The reference electronic device 380 includes a memory chip. In a test operation, the memory chip is electrically connected to the first semiconductor device 12 of the test object 10.

The socket substrate 360 includes first pads 362 and second pads 364. Interconnection lines (not shown) are formed on the socket substrate 360 for electrically connecting the first pads 362 and the second pads 364. The second pins 350 of the second connection unit 460 are used for electrically connecting the first pads 362 of the socket substrate 360 directly to the connection terminals 16 of the test object 10. Pogo pins having elastic cores (not shown) can be used as the second pins 350. Ends of the second pins 350 are brought into contact with the connection terminals 16 of the test object 10, respectively, and the other ends of the second pins 350 are brought into contact with the first pads 362 of the socket substrate 360, respectively.

The reference electronic device 380 is mounted on the socket substrate 360 and makes electric contact with the second pads 364 of the socket substrate 360. The reference electronic device 380 can be mounted on the socket substrate 360 by soldering. In this case, the reference electronic device 380 can be reliably connected to the second pads 364 of the socket substrate 360. Alternatively, the reference electronic device 380 can be detachably mounted on the socket substrate 360 using fasteners, such as screws, for example. In this case, the reference electronic device 380 can be easily replaced.

Electrical connection states of the first and second connection terminals 14 and 16 of the test object 10 can be tested using the test apparatus 2 as follows. For example, a signal output from the test board 120 is transmitted to the reference electronic device 380 sequentially through the first pins 330, the first connection terminals 14 of the test object 10, the first semiconductor device 12 of the test object 10, the connection terminals 16, the second pins 350, and the socket substrate 360. Then, the signal is transmitted from the reference electronic device 380 back to the test board 120 through the socket substrate 360, the second pins 350, the connection terminals 16, the first semiconductor device 12 of the test object 10, the first connection terminals 14, and the first pins 330. The test unit 100 evaluates connection states and other electric characteristics of the first and second connection terminals 14 and 16 of the test object 10 using the signal returned from the reference electronic device 380.

Exemplary elements of the socket 400 will now be described. The housing 420 includes a first body 320 and a second body 340. The first and second bodies 320 and 340 can be detachably coupled together. The first body 320 is fixed to the test unit 100 and the second body 340 is fixed to the handler 200. A support 240 is mounted on the test unit 100 for fixing the first body 320 to the test unit 100. The support 240 has a rectangular shape with a central opening. Therefore, the first body 320 can be fixed to the test unit 100 through the opening of the support 240. A recess 328 is formed in a top center portion of the first body 320 for receiving the test object 10. In addition, a plurality of first holes 322 is formed in the first body 320. The first holes 322 penetrate the first body 320 from a bottom surface of the recess 328 to a bottom surface of the first body 320. The first holes 322 are aligned with the first pads 122 of the test board 120 and the first connection terminals 14 of the test object 10 disposed in the recess 328. The first pins 330 are inserted in the first holes 322.

The socket substrate 360 is disposed between the second body 340 and the handler 200. The socket substrate 360 and the second body 340 are fixed to the handler 200 using fasteners (not shown), such as screws.

A plurality of second holes 342 are formed in the second body 340. The second holes 342 are formed through the second body 340 in a vertical direction from a top surface of the second body 340 to a bottom surface of the second body 340. The second holes 342 are aligned with the first pads 362 of the socket substrate 360 and the second connection terminals 16 of the test object 10 disposed in the recess 328 of the first body 320. The second pins 350 are inserted in the second holes 342. Vacuum holes 202 are formed through center portions of the socket substrate 360 and the second body 340 to allow the handler 200 to create a vacuum for holding the test object 10. As shown in FIGS. 2 and 3, a recess 348 can be formed in the top surface of the second body 340 for receiving the reference electronic device 380 mounted on the socket substrate 360. Alternatively, the reference electronic device 380 can be disposed outside the second body 340 by forming the socket substrate 360 wider than the second body 340 and mounting the reference electronic device 380 on a peripheral portion of the socket substrate 360.

In this embodiment, the reference electronic device 380 is directly in contact with the second pads 364 of the socket substrate 360. However, the reference electronic device 380 can be electrically connected to the second pads 364 of the socket substrate 360 through, for example; pogo pins (not shown).

The second body 340 needs to be accurately coupled to the first body 320 for reliable electric contact between the test object 10 and the first pins 330. For this, alignment pins 344 protrude downward from the bottom surface of the second body 340, and alignment holes 324 are formed in the top surface of the first body 320 for receiving the alignment pins 344. Alternatively, the alignment pins 344 can be formed on the top surface of the first body 320, and the alignment holes 324 can be formed in the bottom surface of the second body 340. In addition, alignment pins 220 protrude downward from a bottom surface of the handler 200, and alignment holes 242 are formed in a top surface of the support 240. Alternatively, the alignment pins 220 can be formed on the top surface of the support 240, and the alignment holes 242 can be formed in the bottom surface of the handler 200. This alignment pin/hole structure can be formed only at the first and second bodies 320 and 340, or the support 240 and the handler 200.

Figure 4:
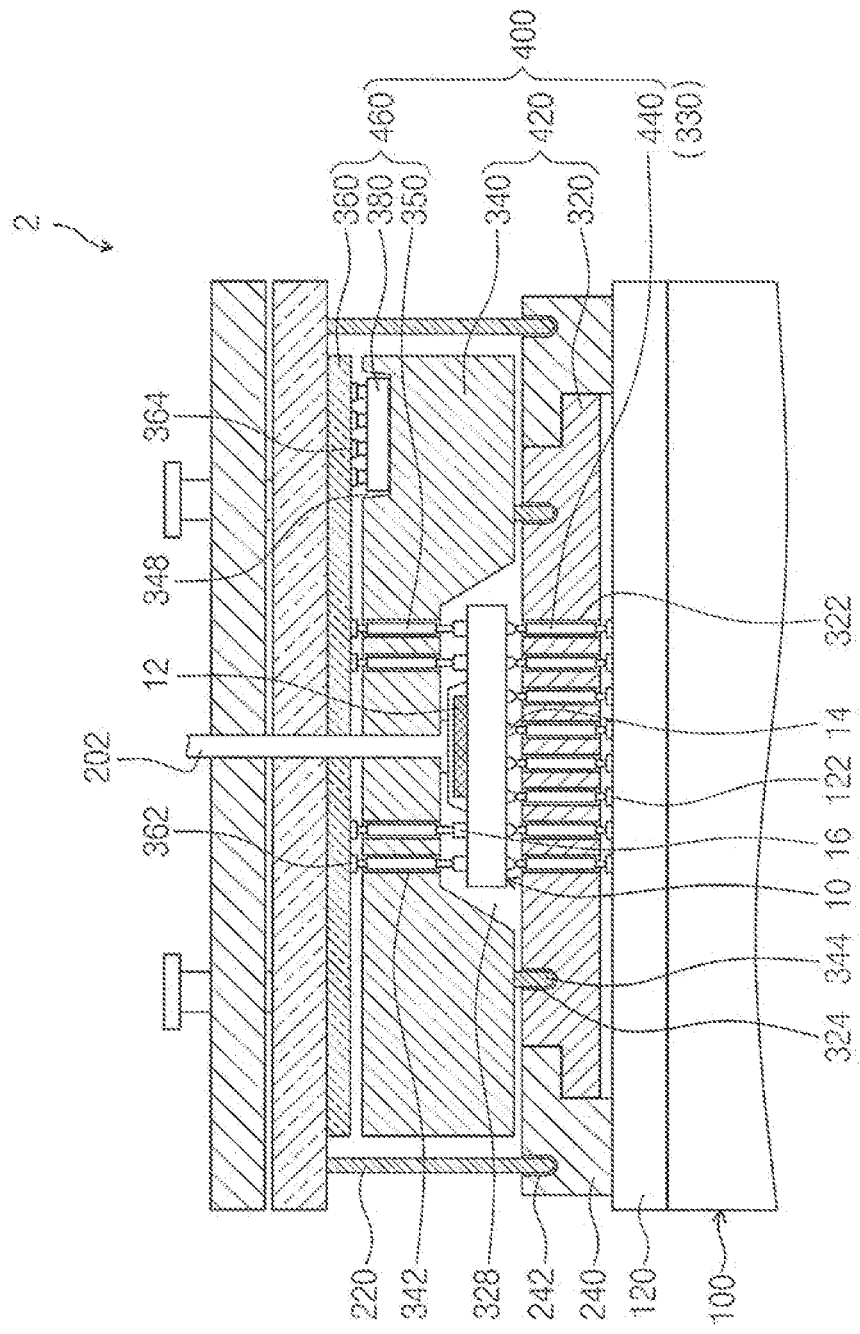
FIG. 4 is a cross-sectional view illustrating an embodiment of a modified version of the test apparatus depicted in FIG. 3.

In FIGS. 2 and 3, the recess 328 is formed in the first body 320 to receive the test object 10. Alternatively, the recess 328 can be formed in the bottom surface of the second body 340 for receiving the test object 10 as shown in FIG. 4.

In the above-described first embodiment, the test object 10 includes a semiconductor device having a logic chip; the reference electronic device 380 includes a semiconductor device having a memory chip; and the test object 10 exchanges electric signals with the reference electronic device 380. Alternatively, both the test object 10 and the reference electronic device 380 can be semiconductor devices having memory chips. In such a case, interconnection lines can be formed on the test object 10 for connecting the first connection terminals 14 directly to the second connection terminals 16.

In the first embodiment, the electric connection states of the first connection terminals 14 formed on the bottom surface of the test object 10 can be measured simultaneously with the electric connection states of the second connection 16 formed on the top surface of the test object 10. Furthermore, before the test object 10 (i.e., the first semiconductor device package 10) and the semiconductor device package 20 are vertically coupled using the solder balls 30, the test object 10 can be tested under conditions similar to those of the case where the test object 10 and the semiconductor device package 20 are vertically coupled. In addition, if the test object 10 is a semiconductor device package in which a semiconductor device having a logic chip is packaged, it is possible to perform an "at speed test" by including a memory chip in the socket 400.

Figure 5:
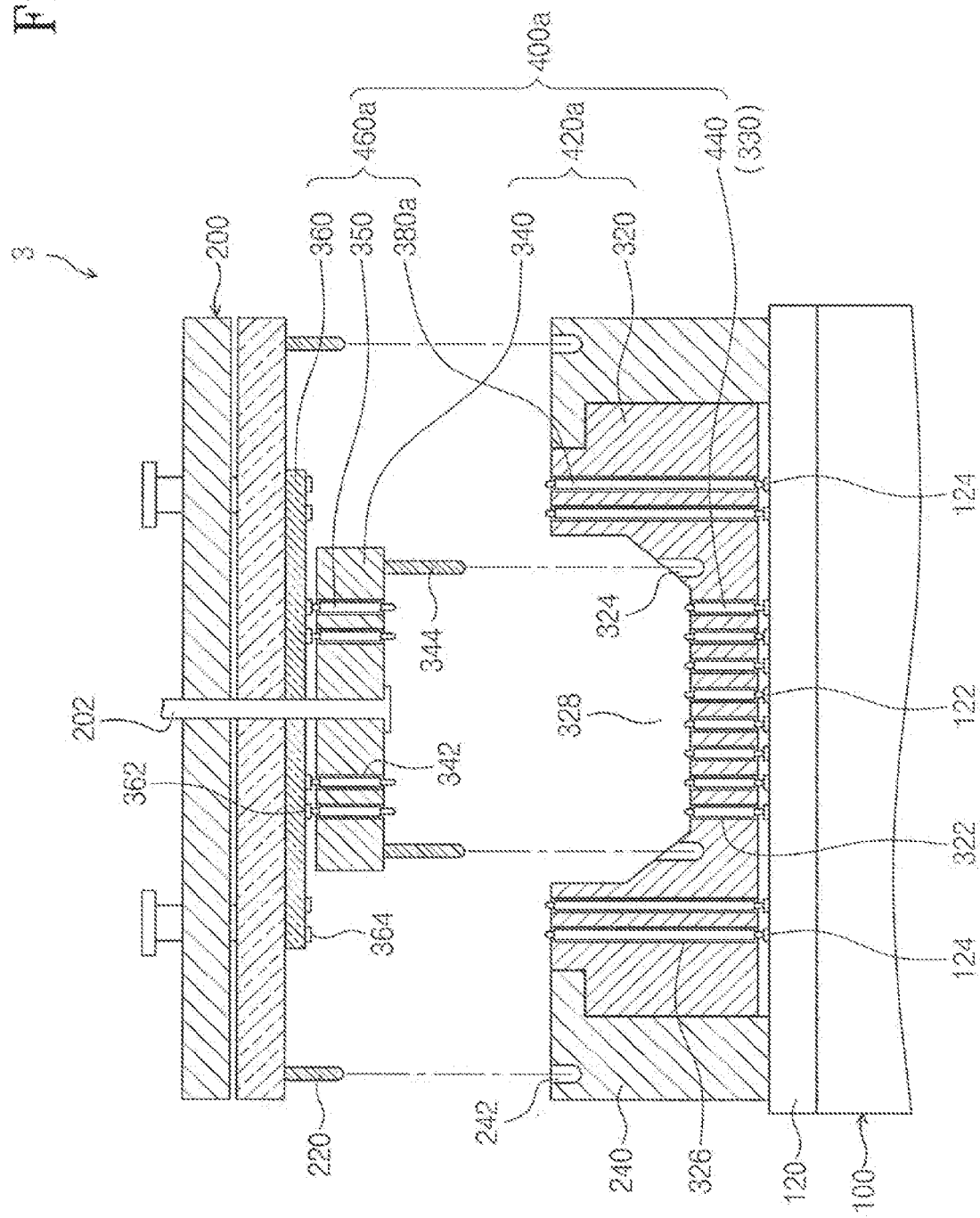
FIG. 5 is an exploded cross-sectional view illustrating a second embodiment of a test apparatus according to another aspect of the present invention.
Figure 6:
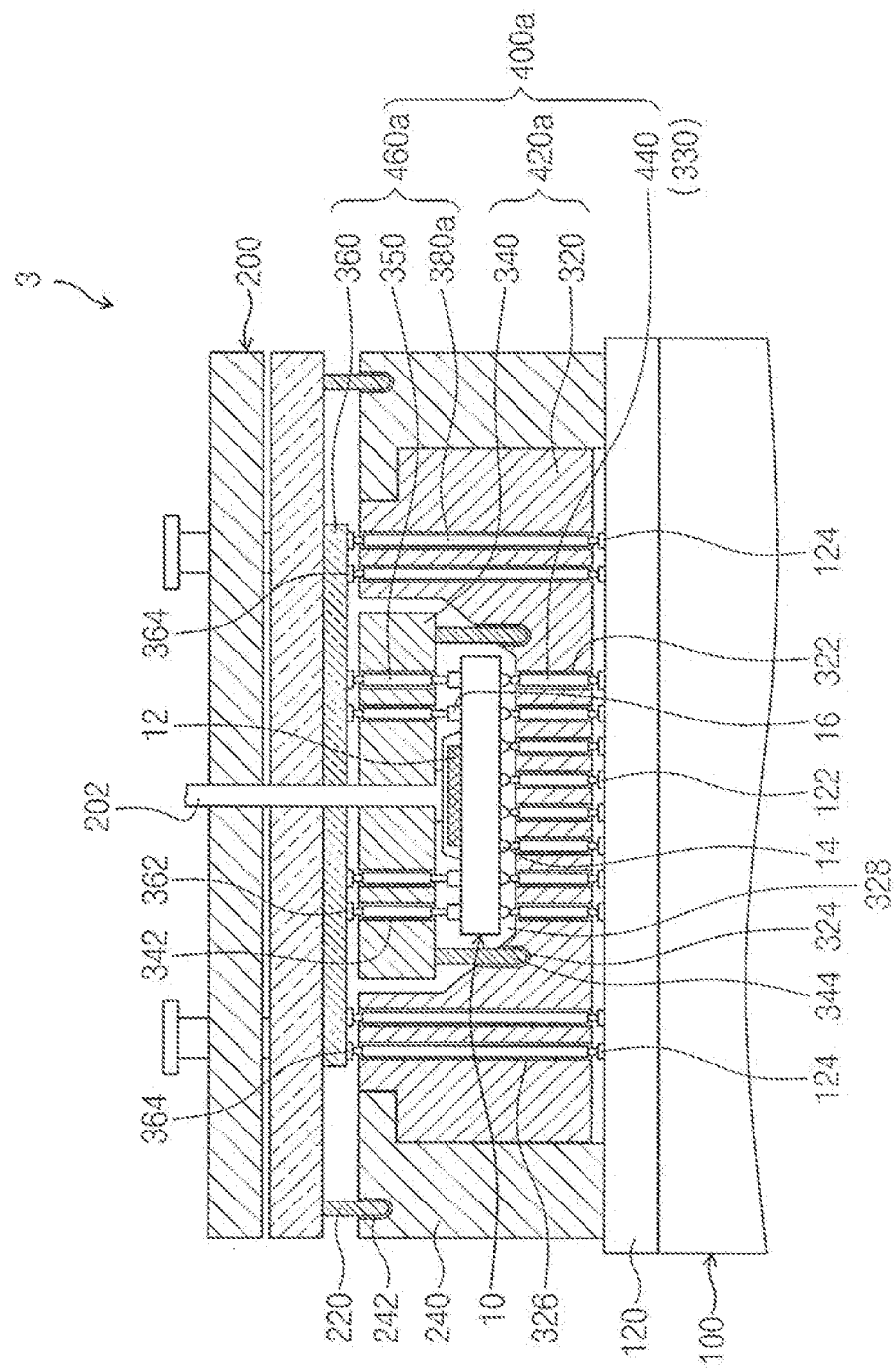
FIG. 6 is a cross-sectional view illustrating the test apparatus of FIG. 5 assembled for testing a semiconductor device package loaded therein.

FIG. 5 is an exploded cross-sectional view illustrating another embodiment of a test apparatus 3 according to another aspect of the present invention, and FIG. 6 is a cross-sectional view illustrating the test apparatus 3 assembled for testing the test object 10.

Referring to FIGS. 5 and 6, the test apparatus 3 includes a test unit 100, a handler 200, and a socket 400a. The test unit 100 applies a signal to the test object 10 and receives a signal output from the test object 10 in response to the input signal. The test unit 100 evaluates the state of the test object 10 using the signal output from the test object 10. The test unit 100 includes a test board 120. First pads 122 and second pads 124 are formed on the test board 120. The first pads 122 can be used to apply signals to the test object 10, and the second pads 124 can be used to receive signals from the test object 10. The socket 400a electrically connects the test object 10 and the test board 120. The handler 200 is used to move the test object 10 to the socket 400a. The test unit 100 and the handler 200 have typical structures. Thus, detailed descriptions of the test unit 100 and handler 200 will be omitted. The socket 400a is a characteristic element of the test apparatus 3. In the following description, the socket 400a will be mainly described in detail, and features of the test unit 100 and handler 200 different from typical structures will be described.

The socket 400a includes a housing 420a, a first connection unit 440, and a second connection unit 460a. The housing 420a is disposed between the handler 200 and the test board 120 for receiving the test object 10 during a test operation. The first connection unit 440 is used to evaluate electrical connection states of the first connection terminals 14 of the test object 10. The second connection unit 460a is used to evaluate electrical connection states of the connection terminals 16 of the test object 10.

The first connection unit 440 includes a plurality of first pins 330 for electrically connecting the first connection terminals 14 of the test object 10 directly to the first pads 122 of the test board 120. Pogo pins having elastic cores (not shown) can be used as the first pins 330. Ends of the first pins 330 are brought into contact with the first connection terminals 14 of the test object 10, respectively, and the other ends of the first pins 330 are brought into contact with the first pads 122 of the test board 120, respectively.

The second connection unit 460a includes a socket substrate 360, second pins 350, and third pins 380a. The socket substrate 360 includes first pads 362 and second pads 364. Interconnection lines (not shown) are formed on the socket substrate 360 for electrically connecting the first pads 362 and the second pads 364. The second pins 350 of the second connection unit 460 are used for electrically connecting the first pads 362 of the socket substrate 360 directly to the connection terminals 16 of the test object 10. Pogo pins having elastic cores (not shown) can be used as the second pins 350. Ends of the second pins 350 are brought into contact with the connection terminals 16 of the test object 10, respectively, and the other ends of the second pins 350 are brought into contact with the first pads 362 of the socket substrate 360, respectively. The third pins 380a are used for electrically connecting the second pads 364 of the socket substrate 360 directly to the second pads 124 of the test board 120. Ends of the third pins 380a are brought into contact with the second pads 364 of the socket substrate 360, respectively, and the other ends of the third pins 380a are brought into contact with the second pads 124 of the test board 120, respectively.

Electrical connection states of the first and second connection terminals 14 and 16 of the test object 10 can be tested as follows. As an example, a signal output from the test board 120 is transmitted to the socket substrate 360 through the first pins 330, the first connection terminals 14 of the test object 10, the first semiconductor device 12 of the test object 10, the second connection terminals 16, and the second pins 350. Then, the signal is transmitted from the socket substrate 360 back to the test board 120 through the third pins 380a. The test unit 100 evaluates connection states and other electric characteristics of the first and second connection terminals 14 and 16 of the test object 10 using the returned signal.

Exemplary elements of the socket 400a will now be described. The housing 420a includes a first body 320 and a second body 340. The first and second bodies 320 and 340 can be detachably coupled together. The first body 320 is fixed to the test unit 100, and the second body 340 is fixed to the handler 200. A support 240 is mounted on the test unit 100 for fixing, the first body 320 to the test unit 100. The support 240 has a rectangular shape with a central opening. Therefore, the first body 320 can be fixed to the test unit 100 through the opening of the support 240. A recess 328 is formed in a lop center portion of the first body 320 for receiving the test object 10. In addition, a plurality of first holes 322 is formed in the first body 320. The first holes 322 penetrate the first body 320 from a bottom surface, of the recess 328 to a bottom surface of the first body 320. The first holes 322 are aligned with the first pads 122 of the test board 120 and the first connection terminals 14 of the test object 10 disposed in the recess 328. The first pins 330 are inserted in the first holes 322. Third, holes 326 are formed through the first body 320 outside the recess 328. The third holes 326 are vertically formed through the first body 320 from the bottom surface to the top surface of the first body 320. The third holes 326' are aligned with the second pads 364 of the socket substrate 360 and the second pads 124 of the test board 120. The third pins 380a are inserted in the third holes 326.

The socket substrate 360 is disposed between the second body 340 and the handler 200. The socket substrate 360 and the second body 340 are fixed to the handler 200 using fasteners (not shown), such as screws.

After the first body 320 and the second body 340 are coupled together, the second body 340 is disposed in the recess 328 of the first body 320, and the top surfaces of the first body 320 and the second body 340 are placed approximately on the same horizontal plane. A plurality of second holes 342 is formed in the second body 340. The second holes 342 are formed through the second body 340 in a vertical direction from the top surface of the second body 340 to the bottom surface of the second body 340. The second holes 342 are aligned with the first pads 362 of the socket substrate 360 and the second connection terminals 16 of the test object 10 disposed in the recess 328 of the first body 320. The second pins 350 are inserted in the second holes 342. Vacuum holes 202 are formed through center portions of the socket substrate 360 and the second body 340 to allow the handler 200 to creates vacuum for holding the test object 10.

In this embodiment, the second body 340 is preferably accurately coupled to the first body 320 for reliable electric contact between the test object 10 and the first pins 330, and the socket substrate 360 and the third pins 380a. For this, alignment pins 344 protrude downward from the bottom surface of the second body 340, and alignment holies 324 are formed in a bottom surface of the recess 328 of the first body 320 for receiving the alignment pins 344. Alternatively, the alignment pins 344 can be formed on the first body 320, and the alignment holes 324 can be formed in the second body 340. In addition, alignment pins 220 protrude downward from a bottom surface of the handler 200, and alignment holes 242 are formed in a top surface of the support 240. Alternatively, the alignment pins 220 can be formed on the support 240, and the alignment holes 242 can be formed in the handler 200. This alignment pin/hole structure can be formed only at the first and second bodies 320 and 340, or the support 240 and the handler 200.

Figure 7:
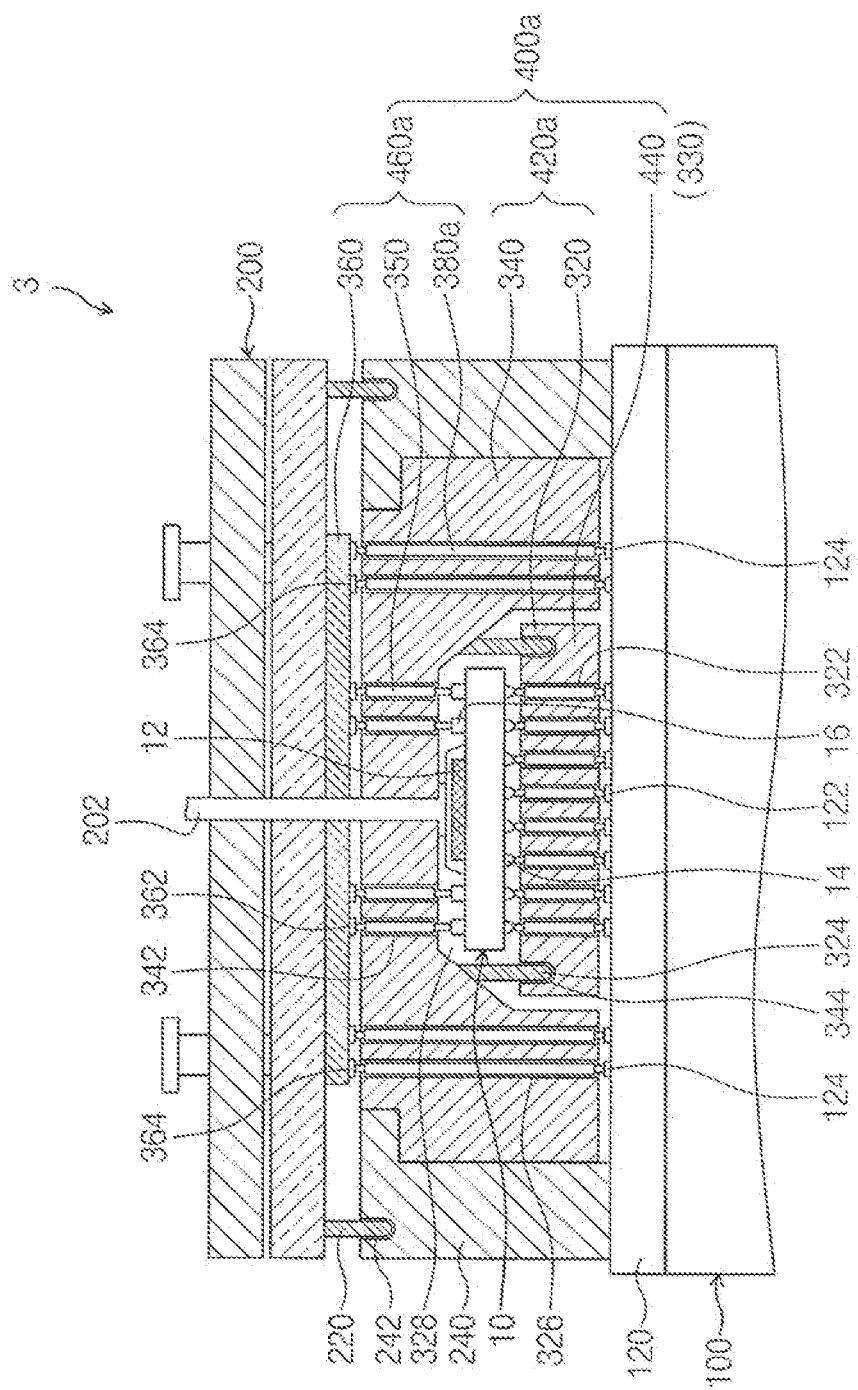
FIG. 7 is a cross-sectional view illustrating an embodiment of a modified version of the test apparatus depicted in FIG. 6.

In FIGS. 5 and 6, the recess 328 is formed in the first body 320 to receive the test object 10. Alternatively, the recess 328 can be formed in the bottom surface of the second body 340 for receiving the test object 10 as shown in FIG. 7. In this case, when assembled, the bottom surfaces of the first body 320 and the second body 340 can be placed on the same horizontal plane. In addition, the third holes 326 can be formed in the second body 340 outside the recess 328.

In the second embodiment, the electric connection states of the first connection terminals 14 formed on the bottom surface of the test object 10 can be measured simultaneously with the electric connection states of the second connection terminals 16 formed on the top surface of the test object 10.

According to aspects of the present invention, the connection states of the connection terminals disposed on the bottom surface of the test object can be tested simultaneously with the connection states of the connection terminals disposed on the top surface of the test object.

In addition, before the first and second semiconductor device packages are coupled together using solder balls, the first and second semiconductor device packages can be tested under conditions similar to those in a case where the first and second semiconductor device-packages are coupled together.

The above-disclosed subject matter is to be considered illustrative, and not restrictive, and the appended claims are intended to cover all modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A socket for testing electric characteristics of a test object, the socket comprising:
    a first connection unit configured to be electrically connected to first connection terminals disposed on a bottom surface of the test object; and
    a second connection unit configured to be electrically connected to second connection terminals disposed on a top surface of the test object,
    wherein the test object comprises a first semiconductor chip, and
    wherein the second connection unit comprises:
        a socket substrate configured to be electrically connected to the second connection terminals of the test object; and
        a second semiconductor chip directly electrically connected to and mounted to the socket substrate in order to exchange electric signals with the test object.

2. The socket of claim 1, wherein the second semiconductor chip is packaged in a semiconductor device package.

3. The socket of claim 1, wherein:
    the socket substrate comprises first pads and second pads electrically connected together,
    the first pads are configured to be connected to the second connection terminals of the test object through second pins included in the second connection unit, and
    the second pads are configured to be electrically connected to the second semiconductor chip.

4. The socket of claim 3, wherein the first connection unit comprises first pins configured to be electrically connected to the first connection terminal of the test object.

5. The socket of claim 4, further comprising a housing configured to receive the test object.

6. The socket of claim 5, wherein the housing comprises:
    a first body; and
    a second body configured to detachably couple to the first body.

7. The socket of claim 6, wherein the first pins are inserted in first holes formed through the first body and the second pins are inserted in second holes formed through the second body.

8. The socket of claim 6, wherein an alignment pin is disposed on one of the first body and the second body, and an alignment hole is formed in the other of the first body and the second body and configured to receive the alignment pin.

9. The socket of claim 1, wherein the socket substrate is further configured to be electrically connected to third pins included in one of the first connection unit and the second connection unit.

10. The socket of claim 9, wherein:
    the socket substrate comprises first pads and second pads electrically connected together,
    the first pads are configured to be connected to the second terminals of the test object through second pins included in the second connection unit, and
    the second pads are configured to be electrically connected to the third pins.

11. The socket of claim 10, wherein the first connection unit comprises first pins configured to be electrically connected to the first connection terminal of the test object.

12. The socket of claim 11, further comprising a housing configured to receive the test object.

13. The socket of claim 12, wherein the housing comprises:
    a first body; and
    a second body configured to detachably couple to the first body.

14. The socket of claim 13, wherein the first pins are inserted in first holes formed through the first body, the second pins are inserted in vertical holes formed through the second body, and the third pins are inserted in third holes formed in one of the first body and the second body.

15. The socket of claim 13, wherein a recess is formed in one of the first and second bodies and configured to receive the test object, and the other of the first and second bodies is inserted in the recess when the test object is tested.

16. The socket of claim 13, wherein an alignment pin is disposed on one of the first body and the second body, and an alignment hole is formed in the other of the first body and the second body and configured to receive the alignment pin.

17. The socket of claim 3, wherein the second semiconductor chip is mounted on the socket substrate and horizontally adjacent to an outermost first pad.

18. The socket of claim 1, further comprising a housing configured to receive the test object.

19. The socket of claim 18, further comprising a recess formed in the housing and wherein the recess is configured to receive the test object during testing of the test object.

20. The socket of claim 1, further comprising suction holes formed through center portions of the socket substrate to create a suction for holding the test object.

* * * * *